(12) United States Patent
Lee (10) Patent No.: US 8,878,228 B2
(45) Date of Patent: Nov. 4, 2014

(54) METHOD FOR PRODUCING LARGE LIGHTING WITH POWER LED

(71) Applicant: Young Seob Lee, Daegu (KR)

(72) Inventor: Young Seob Lee, Daegu (KR)

(73) Assignee: Techen Co., Ltd, Daeg (KR)

( * ) Notice: Subject to any disclaimer, the term of this patent is extended or adjusted under 35 U.S.C. 154(b) by 0 days.

(21) Appl. No.: 13/968,317

(22) Filed: Aug. 15, 2013

(65) Prior Publication Data

US 2013/0328099 A1 Dec. 12, 2013

Related U.S. Application Data

(63) Continuation of application No. 13/512,328, filed as application No. PCT/KR2010/007755 on Nov. 4, 2010, now Pat. No. 8,535,959.

(30) Foreign Application Priority Data

Nov. 27, 2009 (KR) .......................... 10-2009-0116242

(51) Int. Cl.

| | |
|---|---|
| *H01L 33/64* | (2010.01) |
| *F21V 29/00* | (2006.01) |
| *H05K 1/02* | (2006.01) |
| *H05K 3/00* | (2006.01) |
| *F21K 99/00* | (2010.01) |
| *F21Y 101/02* | (2006.01) |
| *F21W 131/103* | (2006.01) |

(52) U.S. Cl.
CPC ............ *H01L 33/647* (2013.01); *H05K 3/0047* (2013.01); *H05K 2201/09854* (2013.01); *F21V 29/246* (2013.01); *H05K 2201/10106* (2013.01); *H01L 33/642* (2013.01); *F21K 9/00* (2013.01); *F21V 29/20* (2013.01); *F21Y 2101/02* (2013.01); *H05K 3/0061* (2013.01); *H05K 2203/1572* (2013.01); *H05K 2201/0305* (2013.01); *F21W 2131/103* (2013.01); *F21V 29/22* (2013.01); *H05K 1/0206* (2013.01)
USPC ............................................... 257/99; 438/26

(58) Field of Classification Search
CPC ..... H01L 33/62; H01L 33/486; H01L 33/642; H01L 33/647
USPC ............................................... 438/26; 257/99
See application file for complete search history.

(56) References Cited

U.S. PATENT DOCUMENTS

| | | | |
|---|---|---|---|
| 6,265,767 B1 * | 7/2001 | Gaku et al. .................... | 257/678 |
| 2006/0180343 A1 * | 8/2006 | Chan et al. ..................... | 174/256 |

(Continued)

FOREIGN PATENT DOCUMENTS

| | | |
|---|---|---|
| DE | 10246892 A1 | 4/2003 |
| DE | 10204016847 A1 | 12/2005 |

(Continued)

*Primary Examiner* — Olik Chaudhuri
*Assistant Examiner* — Christine Enad
(74) *Attorney, Agent, or Firm* — AKC Patents LLC; Aliki K. Collins (57) ABSTRACT

A method of packaging a power light emitting diode (LED). The method may include providing a printed circuit board (PCB) wherein first and second copper (Cu) thin films are formed on both faces of the PCB respectively, forming a single upper opening through an entire thickness of the first Cu thin film and an partial thickness of the PCB, forming a plurality of lower openings, each lower opening extending vertically from the upper opening to the second Cu thin film, forming solder pads on the first Cu thin film, filing a cream solder in the upper opening and the plurality of lower openings so as to be in-plane with the solder pads, mounting a power LED on the PCB so that lead frames of the LED are aligned with the solder pads and a heat-discharge region of the LED is aligned with the cream solder, and soldering the cream solder.

11 Claims, 6 Drawing Sheets

(56) References Cited

U.S. PATENT DOCUMENTS

2008/0006837 A1* 1/2008 Park et al. ................ 257/98
2008/0186682 A1* 8/2008 Sugimura ................. 361/720
2011/0001162 A1* 1/2011 Nakayama et al. .......... 257/99

FOREIGN PATENT DOCUMENTS

DE        202005018009 U1    3/2006
WO    WO 2009128354 A1 *  10/2009

* cited by examiner

Fig. 1

(A) VF-IF characteristic  (B) heat radiation efficiency - life service

METHOD FOR PRODUCING LARGE LIGHTING WITH POWER LED

RELATED APPLICATIONS

This application is a continuation of currently pending U.S. patent application Ser. No. 13/512,328 filed on May 26, 2012, entitled METHOD FOR PRODUCING LARGE LIGHTING WITH POWER LED, which is a 371 application of International Application No. PCT/KR2010/007755, filed Nov. 4, 2010, which in turn claims priority from Korean Patent Application No. 10-2009-0116242, filed Nov. 27, 2009, each of which is incorporated herein by reference in its entirety.

TECHNICAL FIELD

An embodiments of the present invention relates to a method for producing a large lighting with a power LED, and in particular to a method for producing a large lighting with a power LED which makes it possible to quickly disperse, in a multiplexing way, a high temperature heat of a large LED lighting like a streetlight into the temperature of the atmosphere by way of a natural convection type heat radiation device.

BACKGROUND ART

In recent years, as it is urgently needed to reduce the uses of $CO_2$, $SO_2$ and $NO_2$ which are the key factors to global warming, a new lighting development is inevitable, which might attract significant attention as a technology of a green growth helping significantly reduce power consumption and resource waste, maximize the efficiency of light source and embody the coexistence of green and growth.

LED (Light Emitting Diode) lighting using a LED has advantages in terms of both low power consumption and a semi-permanent environment and economic use. It is known to be environmentally friendly with the features that it has a long service life eight times longer than a neon fluorescent lighting, and it has a power consumption 67% lower than an incandescent lamp, and 17% lower than fluorescent lighting, and it uses a mercury free light source which is environmentally friendly; however there are still a lot of problems to be resolved, in view of the efficiencies of light emission.

LED lighting is generally made by binding one or multiple LED devices together which emit red, green and blue colors when electric power is applied to them. The light emitting principle of the LED was observed as light was emitted when applying electric power to a semiconductor in 1907. The electron (e) of the semiconductor has a certain deviation in energy as energy is externally supplied. At the moment electron changes from a higher energy to a lower energy, light emits. When the difference between energies is large, blue color light emits, when small, a red color light emits, and when middle, a green color light emits. The red color LED was for the first time commercialized by the US general electronic (GE) in 1962, and the blue color LED was developed by Shuji Nakamura of Nichia Corporation in 1993. The Nichia Corporation developed a white color LED which emitted a white color light in such a way to adapt a yellow color fluorescent substance to a blue color LED in 1997. Afterward, the LED can emit various colors by combining together red, green and blue colors, even white color. As the white color LED was developed, it became possible to set up a foundation for the purpose of producing a lamp which can substitute an ordinary lighting in the field of an electronic display product.

LED lighting, which uses a LED substituting an ordinary lighting, might be further intensively developed for a research and development for various applications with the aid of an original technology. In terms of the technology of the level of Lumen/Watt [lm/W] representing a light emitting efficiency of a high luminance LED, many leading companies are competitively developing products with the highest light source efficiencies. Nowadays, the US Cree company, the Germany Osram company and the Japan Nichia company account for almost the market shares as they produce most of the related products.

The high luminance power LED lighting produces 3.3V of VF voltage and 700 mA of IF current based on 3 W-level criteria; however it has a problem that a heat radiation of a high temperature heat at a backside of a power LED generating during a procedure that light emits as a large current is applied to a small LED device is hard, generating a big issue.

The power LED, which is a high output LED above 1 watt (W) is known to consume a lot of electric power, and since the current amount is large, a light emitting efficiency is high; however a heating level of a LED chip seems to be high, which needs a proper measurement, otherwise the temperature of a LED chip rises too high, thus degrading a chip itself or a packaging resin. Subsequently, a light emitting efficiency is lowered, for example luminance is lowered, and a service life of a chip is shortened. So, it is necessarily needed to develop a heat radiation technology so that a semi-permanent life span of a LED, which is one of the biggest features, cannot be degraded.

In order for a LED to be used for the purpose of a light source for lighting, a modulation technology of it is necessary needed, the key technology of which is related to a heat radiation design based on a package material. The heat radiation design technology is a key technology needed for the purpose of manufacturing a lighting product using a LED.

The power LED package, which is currently used, has a variety of kinds and is generally used for the purpose of a PCB (Printed Circuit Board) type and a horizontal type; however the common matters of them lie in that the volume increase since a high luminance power LED is used in a PCB state. Besides, there is a limit in increasing the output now that a lot of heat occurs as much as the consuming electric power since the consuming electric power is 0.5~1 watt even though the size of the used chip is 20, 28, 40 mil (1/1000 inches).

The most important matter in terms of a power LED is the loss of a chip due to heat. The aging of the LED goes on fast due to the heat, and the luminance is lowered. In order to resolve the above mentioned problems, domestic and foreign related companies are competitively developing heat sinking planes and are also researching a method for a high efficiency with a lower electric current. Light energy is directed to a thing which emits light with heat itself, so it cannot emit light without generating heat. The important matter lies in that how much heat is actually converted into light energy in order to enhance the efficiency of products, which results in good competitiveness.

In other words, if a heating point temperature is maintained constantly by applying a VF voltage and an IF current to a power LED, the LED might be considered as the LED light source having the highest light emitting efficiency on the earth (refer to FIG. 1); however the problems in terms of the backside heat radiation process technology of the power LED basically remains unresolved, instead it is known to control somehow the heating in such a way that the light emitting efficiency of the power LED device is lowered 30~40% by driving with the current of a tens mA by lowering the VF voltage and the IF current to a degree low enough not to turn off the device of the power LED or in such a way that the voltage is raised, fixing the current. In more details, if the voltage is 3 watt, the use of 700~750 mA is normal; however the currently applied technology is directed to resolving the heat radiation problems by reducing the heat generation in such a way to lower the current as compared with the output by packaging in a form that the voltage is increased, and the current is fixed.

When using the power LED in a place where needs a large light source such as streetlights, security lamps, park lamps, tunnel lamps, factory lamps, plaza halo lamps, angling lamps, military lamps for special operations, search light lamps, etc., it is needed to upgrade the system efficiency of the LED device to 70~85% by driving with a hundreds mA of current rather than to decrease the VF voltage and the IF current.

In Korea, a LED light source module for a white lighting of 2500 lumen/watt [lm/W] and a heat resistance 1 Kelvin/watt (K/W) has been developed, which can be adapted to a head light of a vehicle; however it needs 70 heat radiation chips for 0.95 K/W of a heat resistance for the sake of heat radiation process.

Since a relatively high heat generates at a heat radiation point of a heating portion of a backside of a power LED, the heat radiation process problem should be resolved, so it seems that only the high luminance power LED lighting appliances with a heat radiation process function can have competitiveness.

DISCLOSURE

In light of the above, an embodiment of the present invention is directed to proposing a new applied technology as to a backside heat radiation design in terms of a power LED device for the purpose of the manufacture of a large LED lighting appliance.

Accordingly, an embodiment of the present invention is made in an attempt to resolve the above-mentioned problems, and it is an aspect of the present invention to provide a method for producing a large lighting with a power LED which makes it possible to quickly disperse, in a multiplexing way, the heat into the temperature of the atmosphere, which is accumulated by means of a heat transfer medium in a multi-through hole which lets a heat radiation point of a heat radiation portion of a backside of a power LED come into direct contact with an aluminum structure which is a large heat radiation structure, so a large light source can be emitted with less LEDs by maximizing the efficiency of heat radiation, thus enhancing the efficiency of a light source of a LED device, which consequently results in the production of a large LED lighting appliance.

To achieve the above-mentioned aspects, there is provided a method for producing a large lighting with a power LED which comprises, (A) a step in which one through hole is formed by means of a punching process at part of an upper side in order for a double-sided substrate not to be passed depending on the shape and size of the power LED in the double-sided substrate (FR-4 PCB) in which a Cu thin surface is attached at the upper and lower portions made from a FR-4 material having a solder pad which can fix a lead frame (+ pole and − pole) of the power LED;

(B) a step in which a plurality of through holes are formed by passing through the remaining parts of the double-sided substrate extended from one through hole, so a multi-through hole of a two-tiered structure is formed in such a way that a lower Cu thin surface of a double-sided substrate (FR-4 PCB) is not punched;

(C) a step in which a Pb-free cream solder is injected in the multi-through hole of a two-tiered structure as much as the height of the solder pad for the purpose of providing a heat slug function by using a mechanical device;

(D) a step in which a PCB assembly (PCB Assy) is finished by soldering a Pb-free cream solder for the purpose of ensuring that the heat radiation point of the heating portion of a backside of the power LED and the Pb-free cream solder and the lower Cu thin surface of the double-sided substrate are integrated, by using a movable high temperature equipment after the power LED is properly positioned at the pole plates following the injection of the Pb-free cream solder; and (E) a step in which the PCB assembly is engaged to an aluminum structure which is a large heat radiation structure, thus maximizing the heat radiation efficiency of the LED lighting.

The multi-through hole of a two-tiered structure may be punched at a portion where is vertically matched with a heat radiation point of the power LED heating portion.

The multi-through hole of a two-tiered structure may be previously punched when processing the double-sided substrate (FR-4 PCB).

The multi-through hole of a two-tiered structure may be formed in a circular shape or a quadrangle shape.

The one through hole may have a function by which the Pb-free cream solder injected in one through hole becomes a thermal transfer medium of a Pb soldering structure by means of a movable high temperature equipment, thus fast accumulating a high temperature heat coming from a heat radiation point of the power LED heating portion.

The plurality of the through holes may have functions of dispersing, in a multiplexing way and a fast flow speed type, a high temperature heat fast accumulated in one through hole.

The Pb-free cream solder may be injected before the power LED is engaged to the double-sided substrate (FR-4 PCB).

The PCB assembly and said aluminum structure, which is a large heat radiation structure, may be fixedly attached by a soldering or a thermal grease.

ADVANTAGEOUS EFFECTS

An embodiment of the present invention may have the following advantageous effects.

It is advantageous that an embodiment of the present invention may make it possible to quickly disperse and radiate the heat into the temperature of the atmosphere, which heat is accumulated by means of a heat transfer medium in a multi-through hole which lets a heat radiation point of a heat radiation portion of a backside of a power LED come into direct contact with an aluminum structure which is a large heat radiation structure.

(1) So, a large light source can be emitted with less LEDs by maximizing the efficiency of heat radiation, thus enhancing the efficiency of a light source of a LED device.

(2) As the heat radiation process is reliable, it is possible to manufacture a large LED lighting appliance such as a streetlight.

(3) An embodiment of the present invention may provide a unique effect which helps introduce a new applied technology on a heat radiation design of a backside of a power LED device for the sake of the production of a large LED lighting appliance.

BRIEF DESCRIPTION OF DRAWINGS

FIG. 1(A), (B) is a graph showing a theoretical review on a VF-IF characteristic of a power LED and a heat radiation efficiency and a service life.

FIG. 3(A), (B), (C) is a view illustrating a PCB assembly (PCB Assy) manufacture procedure based on a method for producing a large lighting with a power LED according to an embodiment of the present invention.

MODES FOR CARRYING OUT EMBODIMENTS

Embodiments of the present invention will be described with reference to the accompanying drawings. As to giving the reference numerals to the elements of each drawing, it is noted that the same elements are given the same reference numerals even when they are shown on different drawings. In addition, in the middle of the explanation of the embodiments of the present invention, when it seems that the detailed descriptions on the related known constructions or functions might make the subject matters of the embodiments of the present invention unclear, they will be omitted from the detailed descriptions.

FIG. 1(A), (B) is a graph showing a theoretical review on a VF-IF characteristic of a power LED and a heat radiation efficiency and a service life.

Figure 1:
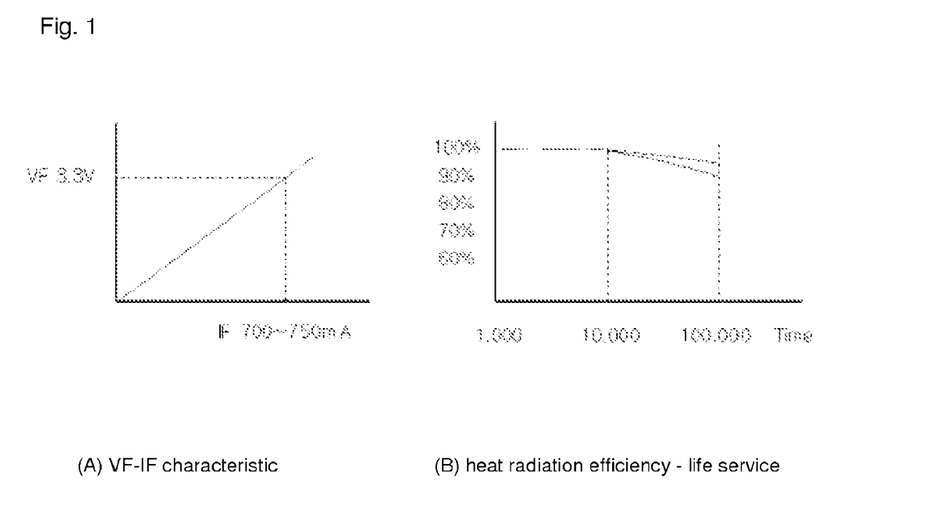

As shown in FIG. 1, if the light emitting output of the high luminance power LED is 3 W, since it is possible to maintain constant the temperature of the heating point when 3.3V of the VF voltage and 700 mA of the IF current are supplied, it is possible to keep the advantages of a long life service of the LED which can keep a light emitting efficiency of above 100% for 1,000 hours, above 95% of 10,000 hours, and above 90% of 100,000 hours.

It is needed to flow a large current of above a hundred mA in order to use a high luminance power LED for the sake of lighting. Here, the temperature of the LED chip rises too high, and the chip itself or the packing resin is thermally degraded, so the luminance drops or the light emitting efficiency is worsened or the service life of the chip is reduced. The development of the heat radiation design technology is necessary for the purpose of maintaining a semi-permanent life service which is the best feature of the LED. So, a technology of an embodiment of the present invention lies in that a method of an embodiment of the present invention is implemented in a natural convection way which helps radiate a high temperature heat coming from the LED chip to the temperature of the atmosphere.

Figure 2:
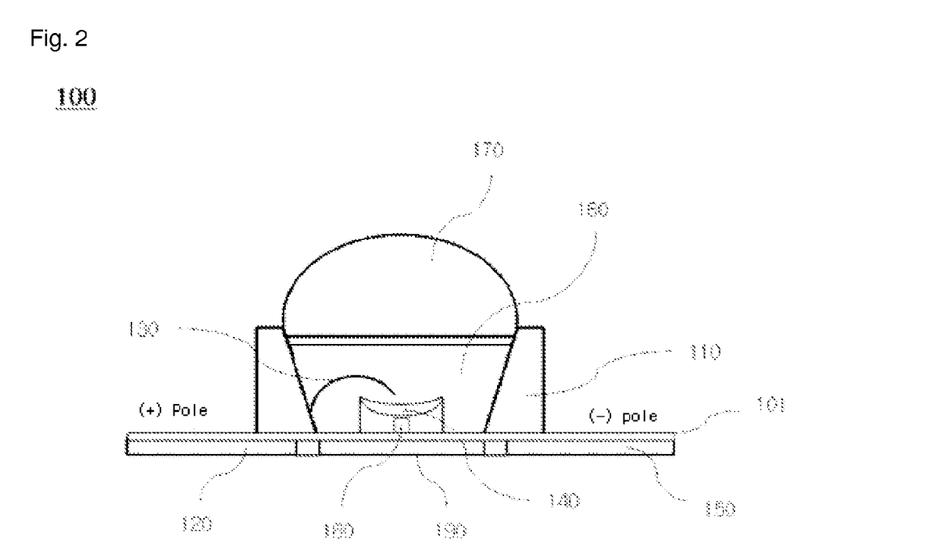
FIG. 2 is a view illustrating a common structure of a power LED.

FIG. 2 is a view illustrating a common structure of a power LED.

As shown in FIG. 2, the high luminance power LED is constituted in such a way that a V-shape reflection mirror 110 is fixed at an electrode plate 101, and an anode (A) terminal 120 is connected to one side of the electrode plate, and a semi-circular Au bonding wire (golf bonding wire) 130 made of Au for the purpose of a reliable electric contact between members is bent toward the cathode (K) terminal 150. In addition, at the center of the V-shaped reflection mirror 110 is mounted a concave lens 140, and to its lower end is connected the cathode (K) terminal 150. When voltage is supplied to the anode (A) terminal 120 and the cathode (K) terminal 150, a discharge starts, and at the same time, light emits by means of a deviation formed as a semiconductor electron (e) transfers from a higher energy to a lower energy toward the cathode (K) terminal 150 via the Au bonding wider 130 connected with the anode (A) terminal 120. In addition, in the interior of the V-shaped reflection mirror 110 is filled the resin mold 160, and on its upper side is mounted the convex lens 170. At the power LED heating portion 180 is formed a heat radiation point 190.

Figure 3:
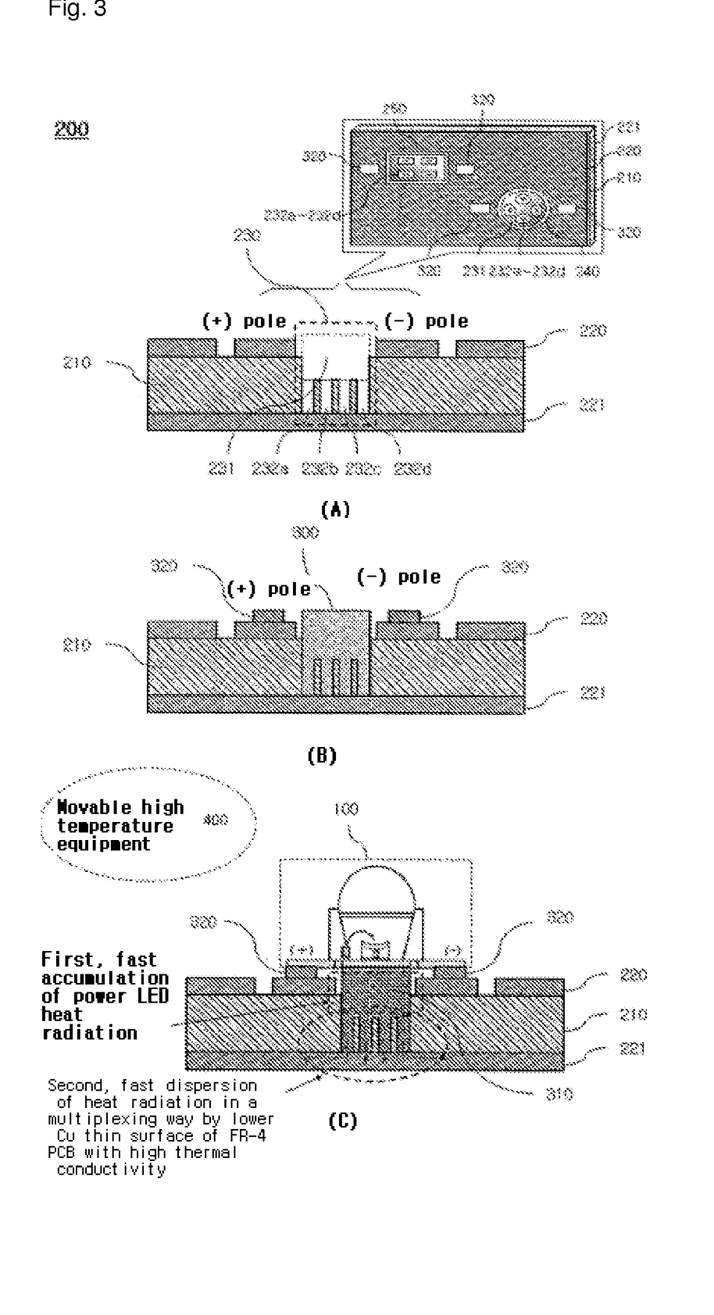

FIG. 3(A), (B), (C) is a view illustrating a PCB assembly (PCB Assy) 500 manufacture procedure based on a method for producing a large lighting with a power LED according to an embodiment of the present invention.

As shown in FIG. 3(A), a multi-though hole of a two-tiered structure is formed at the double-sided substrate (FR-4 PCB) 200 by means of a punching process depending on the shape and size of the power LED.

The double-sided substrate (FR-4 PCB) is a means for positioning the power LED, and Cu thin surfaces 220 and 221 are attached to the upper and lower sides of the FR-4 material 210 which is formed of a solder pad helping fix the lead frame (+ pole and – pole) of the power LED.

The double-sided substrate (FR-4 PCB) provides a PCB assembly (PCB Assy) which can help save a unit cost as compared with the expensive MC PCB (Metal core printed circuit board) and the thermal pad and can help make lighter the whole module members and can help obtain a good attachment flatness of the printed circuit board.

The multi-through hole 230 is a through hole member which accommodates a heat transfer medium for the sake of transferring a high temperature heat coming from the heat radiation point 190 of the power LED heat radiation portion 180 having a two-tiered structure, to the aluminum structure 600 which is a heat radiation structure. At the upper side of the double-sided substrate (FR-4 PCB) 200 is formed one through hole 231 at every portion where the power LED is positioned, and at the lower side extended from one through hole 231 is formed a plurality of through holes 232a~232d by means of a punching process. At this time, it is noted that the lower Cu thin surface 221 of the double-sided substrate (FR-4 PCB) 200 is not punched.

Here, the lower Cu thin surface 221 of the double-sided substrate (FR-4 PCB) 200 is not punched the reasons that the high temperature heat coming from the power LED can be transferred to the aluminum structure 600, which is a large heat radiation structure, as it comes into contact with the Pb-free cream solder 300 soldered (Pb soldering) by means of a movable high temperature equipment 400.

As shown in FIG. 3(B), it shows a state that the Pb-free cream solder 300 is filled in the through member with a multi-through hole of a two-tiered structure by means of a punching process depending on the shape and size of the power LED in the double-sided substrate (FR-4 PCB) 200.

The Pb-free cream solder 300 is a heat transfer medium with the function of a heat slug 310 and is injected in the multi-through hole 230 as high as the height of the solder pad by using a mechanical device.

As shown in FIG. 3(C), it shows a state that a Pb-free cream solder 300 is filled injected into the through member with a multi-through hole of a two-tier structure by means of a punching process depending on the shape and size of the power LED 100 in the double-sized substrate (FR-4 PCB) 200, and it is soldered (Pb soldering) using a movable high temperature equipment 400.

The movable high temperature equipment 400 is a kind of equipment which fixes by supplying a high temperature heat to the Pb-free cream solder 300 by using a heat transfer medium and is featured in that the Pb-free cream solder 300 is soldered by positioning the power LED 100 at the electrode plates (+ and −) after the Pb-free cream solder 300 is soldered, and the solder pad 320 connecting with the lead frame (or anode and cathode) of the power LED 100 is soldered at a high temperature.

Figure 4:
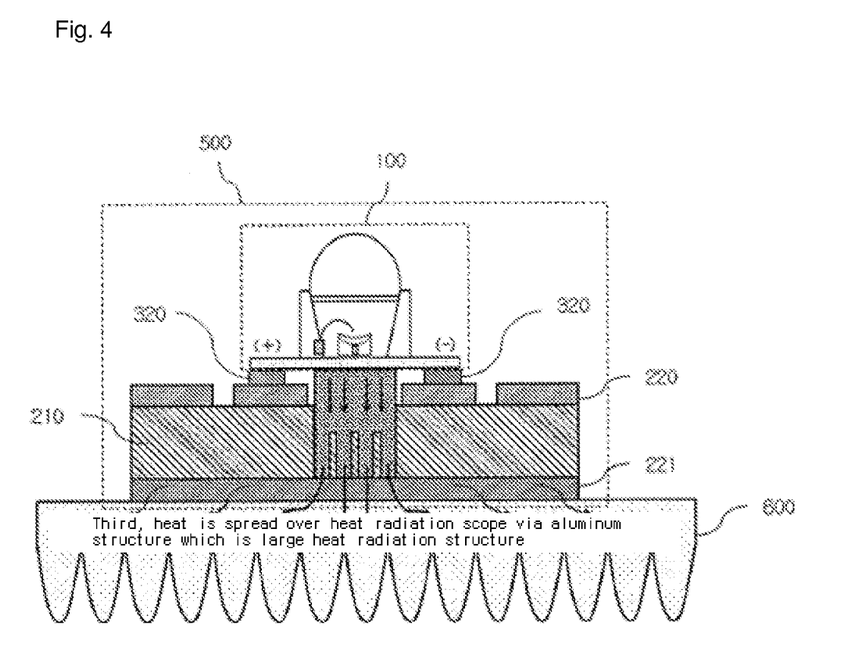
FIG. 4 is a view illustrating a PCB assembly (PCB Assy) finished based on a method for producing a large lighting with a power LED according to an embodiment of the present invention.

FIG. 4 is a view illustrating a PCB assembly (PCB Assy) 500 finished based on a method for producing a large lighting with a power LED according to an embodiment of the present invention.

As shown in FIG. 4, the PCB assembly (PCB Assy) 500 is a means which is formed by packaging the power LED 100, the double-sided substrate (FR-4 PCB) 200 and the Pb-free cream solder 300, in other words, it is a structured means formed by forming an anode electrode as a fixing type cradle structure with a Pb soldering structure so that, by means of the movable high temperature equipment 400, the heat radiation point 190 of the heating portion 180 of the backside of the power LED 100 and the Pb-free cream solder 300 injected into the multi-through hole 230 and the lower Cu thin surface 221 of the double-sided substrate (FR-4 PCB) are integrated as one body and become a heat transfer medium.

Figure 5:
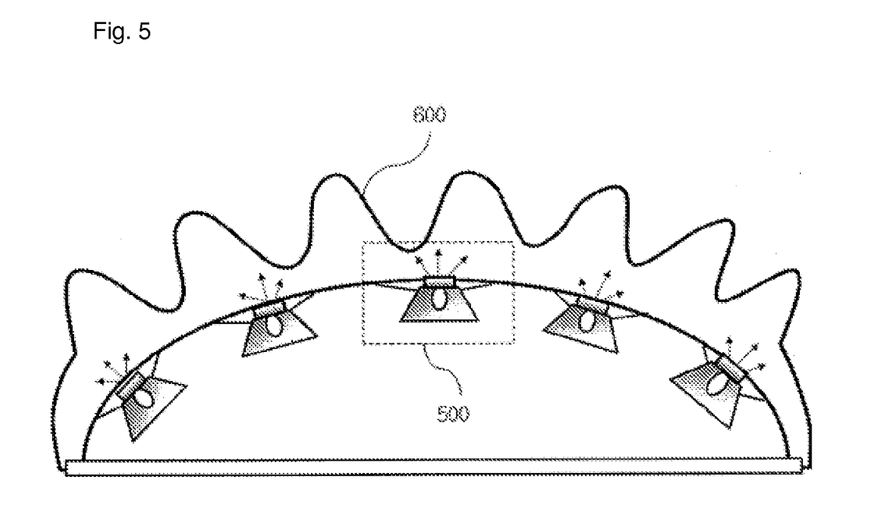
FIG. 5 is a view illustrating a state that a PCB assembly based on a method for producing a large lighting with a power LED is fixed at an aluminum structure which is a large radiation structure according to an embodiment of the present invention.

FIG. 5 is a view illustrating a state that a PCB assembly 500 based on a method for producing a large lighting with a power LED is fixed at an aluminum structure 600 which is a large radiation structure according to an embodiment of the present invention.

As shown in FIG. 5, the PCB assembly 500 is constructed so as to maximize the heat radiation efficiency as a LED lighting as it is fixedly attached to the aluminum structure 600 which is a large heat radiation structure. In addition, it shows an actual size structure which can be used to manufacture a large LED lighting structure such as a streetlight by using it in multiple numbers.

Figure 6:
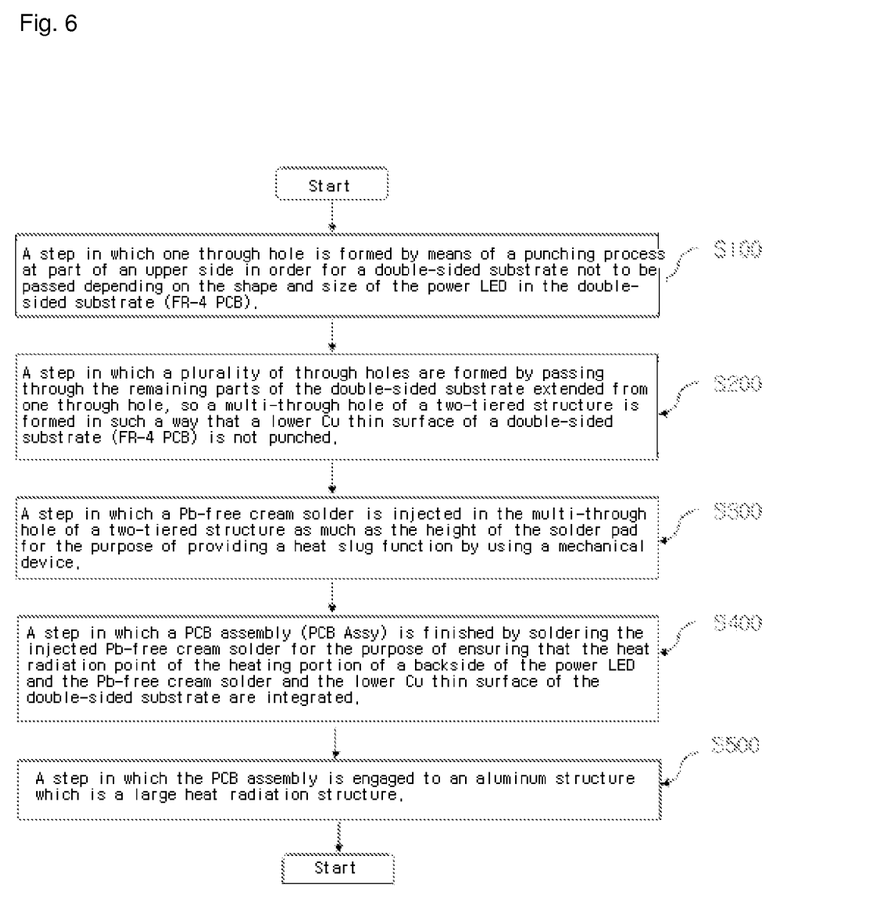
FIG. 6 is a flow chart explaining a method for producing a large lighting with a power LED according to an embodiment of the present invention.

In addition, FIG. 6 is a flow chart explaining a method for producing a large lighting with a power LED of FIGS. 3(A), (B) and (C) through FIG. 5.

As shown in FIG. 6, the method for producing a large lighting with a power LED comprises:

(A) a step S100 in which one through hole is formed by means of a punching process at part of an upper side in order for a double-sided substrate not to be passed depending on the shape and size of the power LED in the double-sided substrate (FR-4 PCB) 200 in which a Cu thin surface 220, 221 is attached at the upper and lower portions made from a FR-4 material 210 having a solder pad 320 which can fix a lead frame (+ pole and − pole) of the power LED.

(B) a step S200 in which a plurality of through holes 232a~232d are formed by passing through the remaining parts of the double-sided substrate extended from one through hole 231, so a multi-through hole 230 of a two-tiered structure is formed in such a way that a lower Cu thin surface 221 of a double-sided substrate (FR-4 PCB) 200 is not punched.

Figure 7:
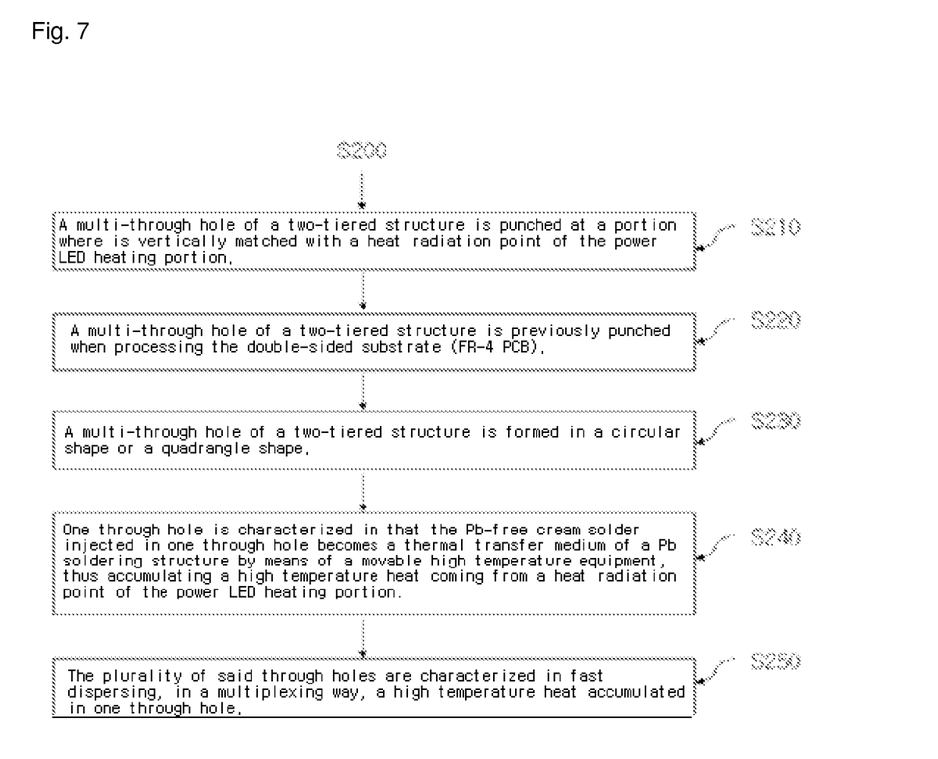
FIG. 7 is a flow chart explaining a multi-through hole of a two-tiered structure based on a method for producing a large lighting with a power LED of FIG. 6.

As shown in FIG. 7, the multi-through hole 230 of a two-tiered structure is characterized in that it is formed at a portion vertically matching with the heat radiant point 190 of the power LED heating portion 180 (S210).

In addition, the multi-through hole 230 of a two-tiered structure is characterized in that it is previously punched at the time of processing the double-sided substrate (FR-4 PCB) (S220).

In addition, the multi-through hole 230 of a two-tiered structure is punched in a circular shape 240 or a quadrangle shape 250 depending on the shape and size of the power LED (S230).

In addition, one through hole 231 is characterized in that the Pb-free cream solder 300 injected into one through hole 231 becomes a heat transfer medium of a Pb soldering structure by means of the movable high temperature equipment 400, thus accumulating the high temperature heat coming from the heat radiation point 190 of the power LED heat radiation portion 180 (S240).

The plurality of the through holes 232a~232d are characterized in that they can quickly disperse, in a multiplexing way, a high temperature heat accumulated at one through hole 231 (S250).

A technical concept of an embodiment of the present invention lies in that there is provided a multi-through hole 230 of a two-tiered structure which is equipped with one through hole 231 and a plurality of the through holes 232a~232d. In other words, the heat coming from the heat radiation point 190 of the power LED heat radiation portion 180 is characterized in that the current increases in order to enhance the light emitting efficiency in case of the large LED lighting such as a streetlight, and as the current rises, the temperature of the heat radiation point of the heating portion increases. An embodiment of the preset invention is directed to multiplying the heat radiation effects in such a way that the heat radiation coming from one through hole 231 accommodating a heat transfer medium having a function of a heat slug with a larger volume than the plurality of the through holes 232a~232d is fast accumulated at the time it emits, and the high temperature radiation having a high thermal expansion coefficient is dispersed in a multiplexing way toward the plurality of the trough holes 232a~232d having a smaller volume than one through hole 231 as in the Bernoulli's theorem in which the flowing speed becomes faster when a fluid passes from a wider tube to a narrow tube.

In other words, the heat coming from the heat radiation point 190 of the power LED heating portion 180 is firstly, quickly accumulated at a Pb-free cream solder 300 injected in one through hole 231 having a heat slug function. At this time, the heat radiation of the power LED accumulated at one through hole 231 has a high thermal expansion coefficient. The Pb-free cream solder 300 injected in the plurality of the through holes 232a~232d can secondary, quickly radiate the heat accumulated at one through hole 231, thus disperse, in a multiplexing way, the heat accumulated in one through hole 231 now what the Pb-free cream solder 300 is directly Pb-soldered with the lower cu thin surface 221 of the double-sided substrate (FR-4 PCB) 200 by means of a soldering. In addition, the heat radiation effects can be thirdly maximized by spreading over a wider heat radiation range in such a way that it is fixedly attached with the lower Cu thin surface 221 of the double-sided substrate (FR-4 PCB) 200 and the aluminum structure 600 which is a large heat radiation structure.

The above-mentioned technical construction is a unique heat radiation design technology developed by the applicant of the present application which is not disclosed so far in the industry.

There is provided (C) a step S300 in which a Pb-free cream solder 300 is injected in the multi-through hole 230 of a two-tiered structure as much as the height of the solder pad for the purpose of providing a heat slug function by using a mechanical device.

Figure 8:
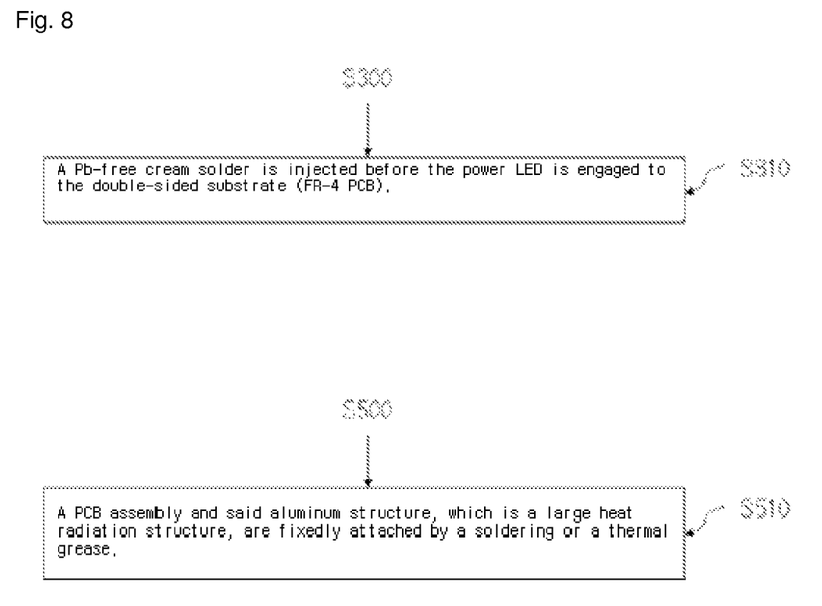
FIG. 8 is a flow chart explaining a step that a Pb-free cream solder and a PCB assembly based on a method for producing a large lighting with a power LED are attached to an aluminum structure which is a large heat radiation structure of FIG. 6.

As shown in FIG. 8, the Pb-free cream solder 300 is characterized in that it is injected into the double-sided substrate (FR-4 PCB) 200 before the power LED is engaged (S310).

There is provided (D) a step S400 in which a PCB assembly (PCB Assy) 500 is finished by soldering a Pb-free cream solder 300 for the purpose of ensuring that the heat radiation point of the heating portion of a backside of the power LED and the Pb-free cream solder 300 and the lower Cu thin surface of the double-sided substrate are integrated, by using a movable high temperature equipment 400 after the power LED 100 is properly positioned at the pole plates following the injection of the Pb-free cream solder 300.

There is provided (E) a step S500 in which the PCB assembly 500 is engaged to an aluminum structure 600 which is a large heat radiation structure, thus maximizing the heat radiation efficiency of the LED lighting.

As shown in FIG. 8, the PCB assembly 500 and the aluminum structure 600 which is a large heat radiation structure are characterized in that they are engaged by a soldering (Pb soldering) or a thermal grease (S510).

According to an embodiment of the present invention, it is possible to propose a new applied technology on a heat radiation design method of a backside of a power LED device for the purpose of producing a large LED lighting appliance such as a streetlight in such a way that the high temperature can be quickly dispersed, in a multiplexing way, into the temperature of the atmosphere, the high temperature heat being accumulated by means of a heat radiation point of a heating portion of a backside of a power LED and a thermal transfer medium in a multi-through hole helping come into direct contact with an aluminum structure which is a large heat radiation structure.

As the present invention may be embodied in several forms without departing from the spirit or essential characteristics thereof, it should also be understood that the above-described examples are not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

The invention claimed is:

1. A method of packaging a power light emitting diode (LED), comprising:
    providing a printed circuit board (PCB) wherein first and second copper (Cu) thin films are formed on both faces of the PCB respectively;
    forming a single upper opening through an entire thickness of the first Cu thin film and a partial thickness of the PCB;
    forming a plurality of lower openings, each lower opening extending vertically from the upper opening to the second Cu thin film;
    forming solder pads on the first Cu thin film;
    filing a cream solder in the upper opening and the plurality of lower openings so as to be in-plane with the solder pads;
    mounting a power LED on the PCB so that lead frames of the LED are aligned with the solder pads and a heat-discharge region of the LED is aligned with the cream solder; and
    soldering the cream solder.

2. The method of claim 1, wherein forming the upper and/or plurality of lower openings are carried out in a punching manner.

3. The method of claim 1, further comprising adhering the second Cu thin film to an aluminum heat-discharge structure.

4. The method of claim 1, wherein the upper and/or plurality of lower openings are formed during providing the PCB.

5. A power light emitting diode (LED) package, comprising:
    a printed circuit board (PCB) comprising first and second copper (Cu) thin films formed on both faces of the PCB respectively;
    a single upper opening formed through an entire thickness of the first Cu thin film and a partial thickness of the PCB;
    a plurality of lower openings, each lower opening extending vertically from the upper opening to the second Cu thin film;
    solder pads formed on the first Cu thin film;
    cream solder filled in the upper opening and in the plurality of lower openings so as to be in-plane with the solder pad sand wherein the cream is heated and soldered into the upper opening and the plurality of lower openings;
    a power LED mounted on the PCB so that lead frames of the LED are aligned with the solder pads; and
    a heat-discharge region of a LED aligned with the cream solder.

6. The package of claim 5, wherein a material of the resin isolation is the same as a material of the PCB.

7. The package of claim 5, wherein the resin isolation is made of FR4.

8. The package of claim 5, wherein the PCB is made of FR4.

9. The package of claim 5, wherein the solder is made of a Pb-free solder.

10. The package of claim 5, further comprising an aluminum heat-discharge structure attached to the first copper thin film.

11. The package of claim 5, wherein the sub-solders are in contact with the first copper thin film.

* * * * *